United States Patent [19]

Steinebrunner et al.

[11] Patent Number: 4,768,615

[45] Date of Patent: Sep. 6, 1988

[54] ACOUSTIC TRANSDUCER SYSTEM

[75] Inventors: Edwin Steinebrunner, Todtnau; Wolfram Berger, Steinen, both of Fed. Rep. of Germany

[73] Assignee: Endress u. Hauser GmbH u. Co., Fed. Rep. of Germany

[21] Appl. No.: 7,102

[22] Filed: Jan. 27, 1987

[30] Foreign Application Priority Data

Jan. 27, 1986 [DE] Fed. Rep. of Germany ....... 3602351

[51] Int. Cl.[4] ............................................ H01L 41/02

[52] U.S. Cl. .................................... 181/157; 181/175; 381/155; 381/158; 381/160; 381/173; 310/322; 310/326; 333/195

[58] Field of Search ........................ 181/157, 158, 175; 333/20, 195; 381/153, 155, 158, 160, 173; 310/312, 322, 324, 326, 334

[56] References Cited

U.S. PATENT DOCUMENTS

| | | | |
|---|---|---|---|
| 3,584,160 | 6/1971 | Janssen | 381/153 |
| 3,849,679 | 11/1974 | Massa | 310/324 |
| 4,333,028 | 6/1982 | Panton | 310/326 |

FOREIGN PATENT DOCUMENTS

| | | |
|---|---|---|
| 0039986 | 4/1983 | European Pat. Off. . |
| 58-124398 | 7/1983 | Japan . |
| 58-124399 | 7/1983 | Japan . |
| 58-124400 | 7/1983 | Japan . |

OTHER PUBLICATIONS

Barone and Juarez–The Journal of the Acoustical Society of America–1972.

*Primary Examiner*—B. R. Fuller
*Attorney, Agent, or Firm*—Barnes & Thornburg

[57] ABSTRACT

The acoustic transducer system includes an electroacoustic transducer and a flexural oscillator plate which is coupled to the electroacoustic transducer. The flexural oscillator plate is so constructed that at the system operating frequency it is stimulated to flexural oscillations of a higher order at which on the flexural oscillator plate node lines form between which antinode zones oscillating alternately in opposite phase lie. To influence the sound radiation of the flexural oscillator plate a sonic beam shaper is provided. The sonic beam shaper has soundwave barriers which are impermeable for soundwaves and which lie spaced from the flexural oscillator plate and acoustically decoupled therefrom in front of first antinode zones oscillating in equal phase with each other, and soundwave-permeable regions which lie between the soundwave barriers in front of the remaining second antinode zones oscillating in opposite phase to the first antinode zones. The sonic beam shaper results in the effect that the flexural oscillator plate radiates only soundwaves of equal phase while the soundwave of opposite phase thereto are suppressed by the soundwave barriers.

6 Claims, 4 Drawing Sheets

ACOUSTIC TRANSDUCER SYSTEM

Figure 1:
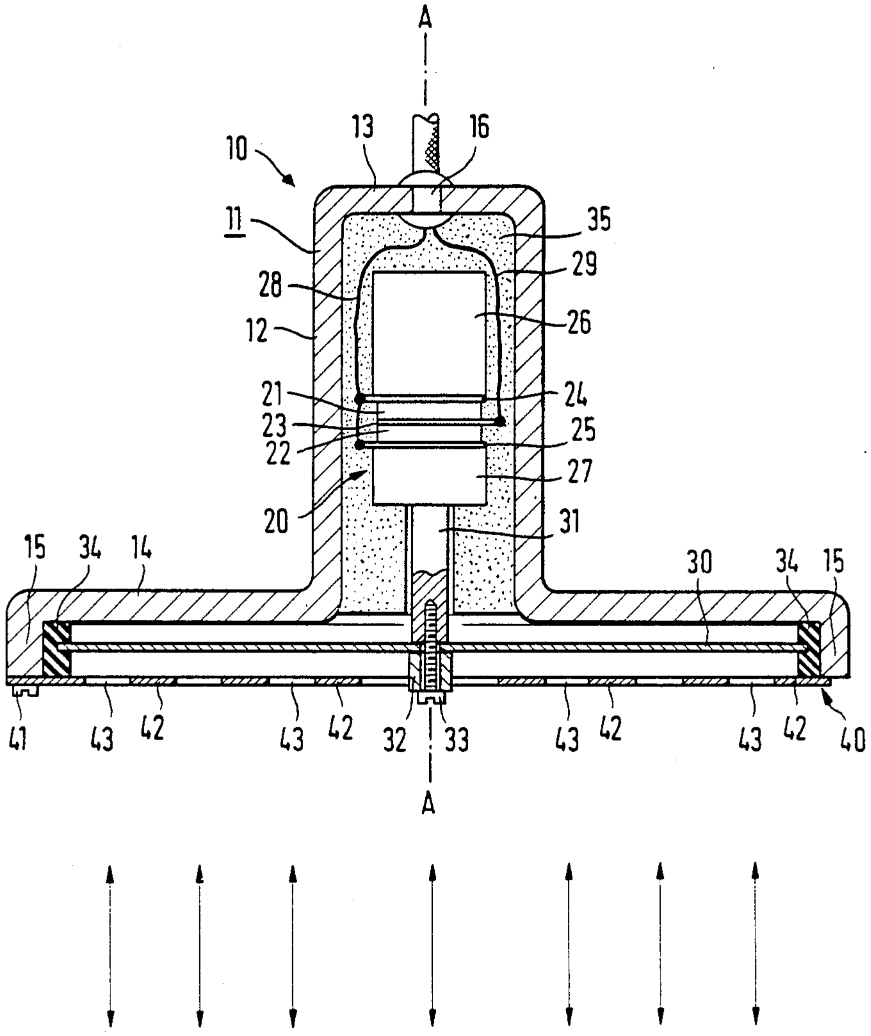

The invention relates to an acoustic transducer system comprising an electroacoustic transducer, a flexural oscillator plate which is so constructed that at the system operating frequency it is stimulated to flexural oscillations of a higher order at which on the flexural oscillator plate node lines form between which antinode zones oscillating alternately in opposite phase lie, and means for influencing the acoustic radiation of the flexural oscillator plate.

Acoustic transducer systems of this type are used in particular as acoustic transmitters and/or acoustic receivers for distance measurement by the echo sounding principle. The travel time of a sound wave radiated by the acoustic transmitter up to a reflecting object and the travel time of the echo sound wave reflected at the object back to the acoustic receiver is measured. When the speed of sound is known the travel time is a measure of the distance to be determined. The frequency of the sound wave may be in the audible range or in the ultrasonic range. In most cases the distance measurement is by the pulse travel time method in which a short sonic pulse is transmitted and the echo pulse reflected at the object received. In this case the same acoustic transducer system can be used alternately as acoustic transmitter and acoustic receiver.

A widespread field of use of this distance measurement with sound waves is the measurement of filling levels. For this purpose the acoustic transducer system is arranged over the filling material to be measured above the highest level occurring so that it irradiates a sonic wave downwardly onto the filling material and receives the echo sonic wave reflected back up at the surface of the filling material. The measured travel time of the sonic wave then gives the distance of the filling material surface from the acoustic transducer system and when the installation height of the acoustic transducer system is known the filling level to be measured can be calculated from this.

To obtain large ranges in the distance measurement with sound waves high-performance acoustic transducer systems of good efficiency are required to ensure that the echo signal received still has an intensity adequate for the evaluation. The efficiency depends mainly on two factors:

1. the adaptation of the acoustic transducer system to the impedance of the transmission medium;

2. the directivity of the acoustic transducer system on sending and receiving the sound waves.

The flexural oscillator plates used in the known acoustic transducer systems serve for impedance adaptation or matching. In the level measurement the transmission medium for the sound waves is gaseous, e.g. air, and this also applies to many other fields of use. The usual electroacoustic transducers, such as piezoelectric transducers, magnetostrictive transducers, etc., have as a rule an acoustic impedance which is very different from the acoustic impedance of air or other gaseous transmission media. They therefore serve in the known acoustic transducer systems only for stimulating the large-area flexural oscillator plates which form the actual acoustic radiators or acoustic receivers and provide a good impedance adaptation to air or other gaseous transmission media.

As regards the desired directivity the large-area flexural oscillator plates also appear advantageous because of course the beaming effect of a radiation lobe is the narrower the greater the extent of the radiation area with respect to the wavelength. However, in the acoustic transducer systems with a flexural oscillator plate set into flexural vibrations of higher order this is precluded by the problem that the antinode zones oscillating alternately in counter phase also emit opposite phase soundwaves which can interfere with each other. The resulting radiation diagram has in the axis perpendicular to the flexural oscillator plate only a relatively small radiation intensity but comprises radiation lobes lying concentrically to the axis and further interfering side lobes.

To avoid this unfavourable radiation diagram it is known from the magazine "The Journal of the Acoustical Society of America", Vol. 51, No. 3 (part 2), p. 953 to 959, to form the regions of the flexural oscillator plate corresponding to the antinode zones alternately with different thickness. The thickness difference is so dimensioned that a phase rotation through 180° is imparted to the soundwaves radiated by the thicker regions. The soundwaves radiated from all the antinode zones then have the same phase so that the radiation diagram has a pronounced radiation maximum in the axial direction in the form of a sharply bundled lobe. However, the manufacture of such a flexural oscillator plate is complicated and expensive. Furthermore, the acoustic transducer system equipped with such a flexural oscillator plate has a very narrow band because the phase rotation through 180° only occurs for a very specific frequency defined by the structure of the flexural oscillator plate. It is therefore not suitable for pulse operation. Finally, it is also not possible to adapt the flexural oscillator plate to a different operating frequency.

In an acoustic transducer system known from European patent No. 0 039 986 the regions of the flexural oscillator plate corresponding to the alternating antinode zones are also formed so that the soundwaves generated by every other antinode zone are given a phase rotation through 180° so that the soundwaves radiated by all the antinode zones are substantially equiphase. For this purpose there is applied to the respective regions of the radiating area of the flexural oscillator plate a low-loss acoustic propagation material of such a thickness that the desired phase rotation is obtained. Suggested as low-loss acoustic propagation material for this purpose are closed-cell foamed plastics or unfoamed elastomers. This material must be cut out corresponding to the form of the antinode zones and adhesively secured to the flexural oscillator plate. This involves problems when the acoustic transducer system is subjected in operation to mechanical stresses or chemical influences as is the case in particular when measuring filling levels. The adhesively attached plastic parts can easily be damaged and moreover only have a small resistance to many chemically aggressive media. Furthermore, they increase the danger of encrustation of dusty or pulverulent or tacky filling materials and this impairs the functionability.

On the other hand, Japanese specification No. 58-124 398 discloses an acoustic transducer system in which in front of a vibration plate connected to a piezoelectric transducer a thin plate having apertures is disposed. In addition a horn radiator is provided. For the arrangement, number, size and form of the apertures in the thin plate numerous different examples are given. However, in this known acoustic transducer system the vibration plate is not a flexural oscillator plate; on the contrary, by a conical form of the vibration plate it is ensured that said plate oscillates as a whole in rigid manner like a piston. Thus, on the vibration plate no node lines form between which antinode zones oscillating alternately in opposite phase lie and consequently association of the apertures in the thin plate with such antinode zones is not possible.

The problem underlying the invention is to provide an acoustic transducer system of the type set forth at the beginning with high efficiency and good radiation characteristic which is easy to make, has a high operational reliability, operates over a very wide band and can be adapted in simple manner to other operating frequencies.

To solve this problem the acoustic transducer system according to the invention comprises a sonic beam shaper having soundwave barriers which are impermeable for soundwaves and which lie spaced from the flexural oscillator plate and acoustically decoupled therefrom in front of first antinode zones oscillating in equal phase with each other, and soundwave permeable regions which lie between the soundwave barriers in front of the remaining second antinode zones oscillating in opposite phase to the first antinode zones.

When the acoustic transducer system according to the invention is used as acoustic transmitter only equiphase soundwaves are transmitted whilst the soundwaves of opposite phase are suppressed by the soundwave barriers. When used as acoustic receiver the incoming soundwave can act only on equiphase oscillating antinode zones of the flexural oscillator plate. Thus, in both cases equally good impedance matching and directional effect as in the known systems are obtained. This is however achieved by a sonic beam shaper which is completely separated from the flexural oscillator plate whereas at said plate itself no changes take place. The suppression of the undesired soundwaves is by reflection and/or absorption at the soundwave barriers. This effect is largely independent of the material of which the soundwave barriers consist. The material of the sonic beam shaper can thus be selected on the one hand with regard to the use conditions of the acoustic transducer system and on the other hand with regard to simple and economic production. In particular, the sonic beam shaper can be made such that it is mechanically robust and resistant to corrosion. By suitable choice of material it is also possible to reduce any danger of encrustation. If nevertheless encrustation takes place the system can be easily cleaned and in addition a self-cleaning effect arises due to the relatively large oscillation amplitudes of the flexural oscillator plate.

An acoustic transducer system according to the invention operates over a very wide band because the suppression of the undesired soundwaves is based on a barrier action which is the same for all frequencies and is independent of maintaining specific phase shifts. It acts as acoustic filter because in conjunction with the sonic beam shaper for reception it gives preference to acoustic frequencies which stimulate the flexural oscillator plate to its desired operating frequency. Furthermore, by simply exchanging the sonic beam shaper the system can easily be adapted to different operating frequencies.

Advantageous embodiments and further developments of the invention are characterized in the subsidiary claims.

Figure 2:
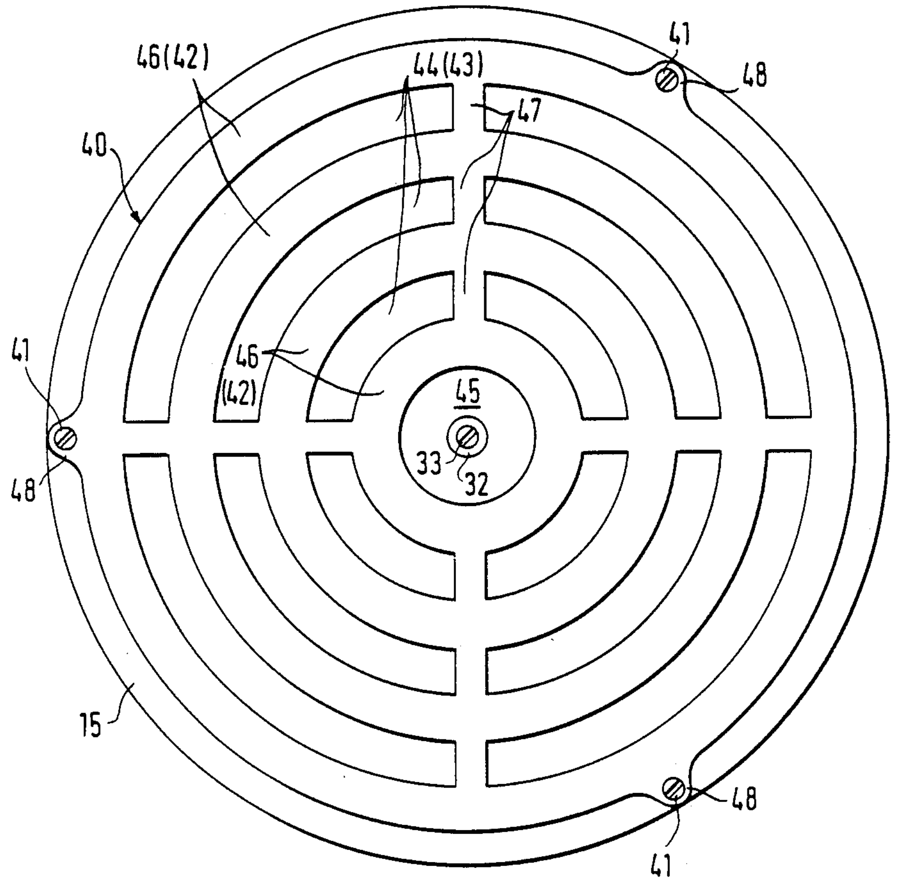
Figure 3:
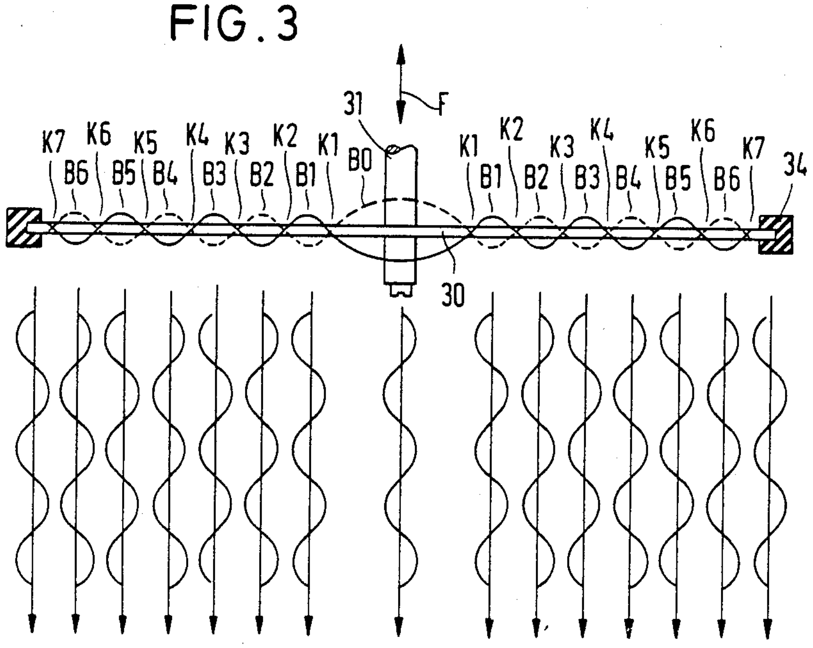
Figure 4:
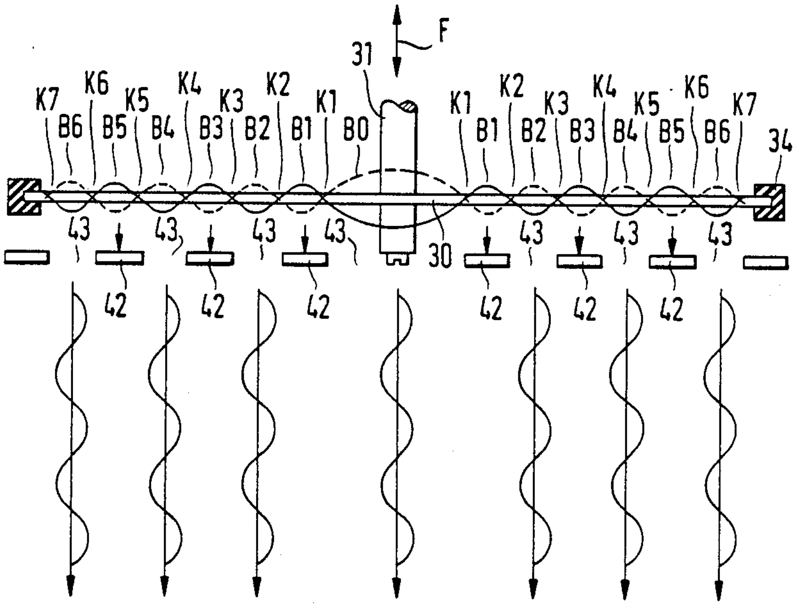
Figure 5:
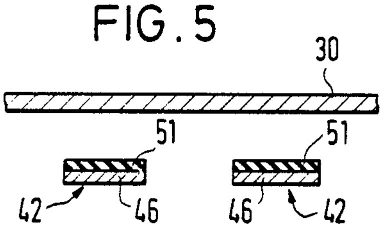
Figure 6:
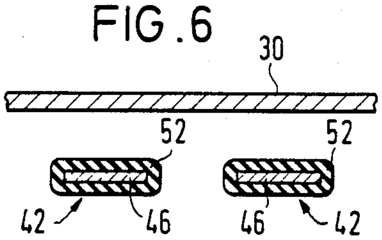
Figure 11:
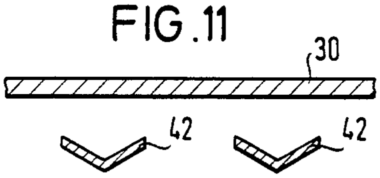
Figure 12:
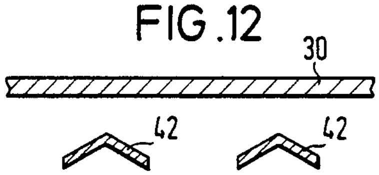
Figure 13:
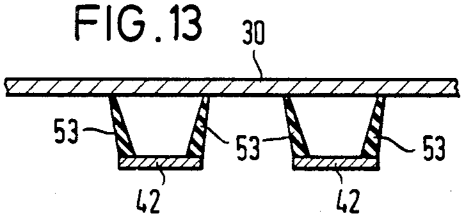

Futher features and advantages of the invention will be apparent from the following description of examples of embodiment which are illustrated in the drawings, wherein:

FIG. 1 is a schematic sectional view of an acoustic transducer system according to the invention, FIG. 2 is an end elevation of the acoustic transducer system with the sonic beam shaper, seen from below in FIG. 1, FIG. 3 is a schematic representation for explaining the mode of operation of the flexural oscillator plate of the acoustic transducer system of FIG. 1, FIG. 4 is a schematic representation for explaining the mode of operation of the sonic beam shaper of the coustic transducer system of FIG. 1, FIG. 5 is a modified embodiment of the soundwave barriers of the sonic beam shaper, FIG. 6 shows a further modification of the soundwave barriers of the sonic beam shaper, FIGS. 7 to 12 show various cross-sectional forms of the soundwave barriers of the sonic beam shaper and FIG. 13 is a partial view of a sonic beam shaper with sealing lips attached to the soundwave barriers to prevent encrustation.

The acoustic transducer system 10 illustrated in FIG. 1 comprises a housing 11 having a tubular section 12 which is sealed at one end by a bottom 13 and merges at the opposite open end into a widened section 14 which has the form of a flat dish with an edge 15. Disposed in an opening of the bottom 13 is a cable passage 16. The entire housing 11 is rotation-symmetrical with respect to its axis A—A so that the edge 15 of the widened portion 14 is circular as apparent from FIG. 2.

In the tubular section 12 an electroacoustic transducer 20 is disposed which in the example of embodiment illustrated is a piezoelectric transducer. It consists of two piezo discs 21 and 22 which are arranged sandwich-like with interposition of a centre electrode 23 between two outer electrodes 24, 25. The sandwich block consisting of the piezoelectric discs 21, 22 and the electrodes 23, 24, 25 is clamped between a support mass 26 and a coupling mass 27. The two outer electrodes 24 and 25 are electrically connected to a common lead 28. The centre electrode 23 is connected to a second lead 29. Thus, the two piezo discs 21, 22 are connected in parallel electrically but lie in series mechanically.

In the widened flat section 14 a thin circular flexural oscillator plate 30 is disposed which is mechanically connected by a rod 31 to the electroacoustic transducer 20. The flexural oscillator plate 30 is clamped in the centre between the rod 31 and a sleeve 32 disposed on the opposite side by a screw 33 which is led through a centre opening of the plate 30 and screwed into an axial threaded bore in the rod 31. The plate 30 is spaced from the bottom of the widened housing portion 14 and its diameter is somewhat less than the internal diameter of the edge 15. The edge of the plate 30 is embedded in a resilient seal 34 which runs round the inner side of the edge 15. The seal 34, made for example of neoprene sponge rubber, prevents penetration of undesired foreign matter into the interior of the housing 11 round the edge of the plate 30 and serves substantially for structureborne sound decoupling between the oscillating plate 30 and the housing 11.

The interior of the tubular housing section 12 can be filled with a casting or potting composition 35 which however leaves free a passage for the rod 31.

At the end side of the edge 15 spaced from the flexural oscillator plate 30 a sonic beam shaper 40 is secured by three screws 41 (FIG. 2). The form and function of the sonic beam shaper 40 will be explained hereinafter in detail.

The purpose of the acoustic transducer system 10 illustrated in FIG. 1 is to convert electrical oscillations to soundwaves which are transmitted in the direction of the axis A—A, i.e. perpendicular to the plane of the flexural oscillator plate 30, or to convert soundwaves which come from said direction into electrical oscillations. The transmitting and receiving direction lies in FIG. 1 perpendicularly beneath the acoustic transducer system, which is the usual method of installation when the acoustic transducer system is to be used as echo-sounding device for measuring a filling level. In such a use the acoustic transducer system is mounted above the highest level which occurs and the soundwaves pass through the air downwardly until they strike the surface of the material, where they are reflected. From the travel time of the soundwaves the distance between the filling material surface and the acoustic transducer system can be calculated and from this distance the filling level. To measure the travel time the soundwaves are generally transmitted in the form of short pulses and the time interval until arrival of the echo pulses is measured. In this case the acoustic transducer system illustrated can be used alternately as acoustic transmitter and acoustic receiver.

For other purposes, for example for range measuring, the acoustic transducer system can of course be operated in any other desired direction.

In all cases to obtain large ranges with the best possible efficiency, i.e. to obtain adequately strong echo signals for reception with the minimum possible transmitting power, two requirements are to be met:

1. a good adaptation of the acoustic transducer system to the acoustic impedance of the transmission medium, e.g. air;

2. a good directivity, i.e. the narrowest possible convergence of the soundwave bundle (sonic beam) in the desired transmission direction, that is in the direction of the axis A—A.

To fulfil the first requirement the flexural oscillator plate 30 is used as acoustic radiator. Its mode of operation will be explained with the aid of FIG. 3.

When an electrical AC voltage is applied to the electrodes 22, 23, 24 via the leads 28, 29 the piezo discs 21, 22 execute thickness oscillations which are transmitted to the rod 31 so that the latter is set into longitudinal oscillations in the direction of the axis A—A. These longitudinal oscillations are indicated in FIG. 3 by the double arrow F. The system operating frequency, i.e. the frequency of the electrical oscillation and thus the frequency of the mechanical oscillation generated by the piezoelectric transducer, is substantially higher than the flexural oscillation natural resonance frequency of the flexural oscillator plate 30 so that said plate 30 is stimulated by the rod 31 to flexural oscillations of higher order. The edge of the flexural oscillator plate 30 is dampened for structure-borne sound due to the resiliency of the material of the seal 34. Thus, on the flexural oscillator plate 30 in the system illustrated in FIG. 3 in cross-section standing waves form with several node lines K1, K2, . . . K7 which are at rest and between which antinode zones B1, B2, . . . B6 are located. The central region of the flexural oscillator plate 30 connected to the rod 31 and lying within the node line K1 is also an antinode zone B0 whose oscillation is forced by the rod 31. Since the flexural oscillator plate 30 is circular the node lines K1, K2, . . . K7 are concentric circles around the centre of the flexural oscillator plate 30.

FIG. 3 shows the oscillation state of the flexural oscillator plate 30 with the maximum deflection of the central region B0 in the one direction indicated by a full line and the maximum deflection in the other direction by a dashed line. The oscillation amplitudes have been shown greatly exaggerated for clarity. It is apparent from the illustration that two antinode zones separated by a node line from each other oscillate in each case in opposite phase to each other. Thus, the odd antinode zones B1, B3, B5 oscillate in the same phase to each other but in opposite phase with the even antinode zones B2, B4, B6.

The large-area flexural oscillator plate 30 set into flexural oscillations of higher order provides very good impedance matching to the transmission medium air or any other gaseous transmission medium. Each antinode zone generates a soundwave which is propagated in the adjacent transfer medium. However, as regards the desired directivity the problem arises that the soundwaves generated by adjacent antinode zones are in each case in opposite phase to each other. In FIG. 3 these soundwaves are indicated by arrows and the phase positions of the soundwaves are represented by the sinusoidal lines running along the arrows. It can thus be seen that the soundwaves originating from the antinode zones B1, B3, B5 are opposite in phase to the soundwaves originating from the antinode zones B0, B2, B4, B6. Such a soundwave distribution does not of course give a pronounced directivity in the axial direction lying perpendicularly to the flexural oscillator plate 30; on the contrary, the directive pattern has pronounced radiation side lobes which lie concentrically to said axial direction and other weaker minor lobes. Because of this poor directional effect in particular when measuring large distances the major part of the transmitted acoustic energy is lost and does not return to the acoustic transducer system.

The same acoustic transducer system can also be used as acoustic receiver, a soundwave impinging thereon setting the flexural oscillator plate 30 into flexural oscillations which are transmitted by the rod 31 to the piezoelectric transducer 20 and converted by the latter into an electrical signal having the frequency of the incoming soundwave. The acoustic transducer system has the same directive pattern in reception as in transmission.

The sonic beam shaper 40 disposed at the end side of the acoustic transducer system serves to improve the directional efficiency of the acoustic transducer system 10. The principle of the function of the sonic beam shaper is shown in FIG. 4. FIG. 4 shows in a manner similar to FIG. 3 the flexural oscillator plate 30 set into flexural oscillations of higher order having the node lines K1, K2 . . . K7 and the antinode zones B0, B1, . . . B6. The sonic beam shaper has soundwave barriers 42, i.e. portions which are substantially impermeable for soundwaves and which are arranged in spaced relationship in front of every other antinode zone, and regions 43 which are permeable for soundwaves and lie in front of the antinode zones lying therebetween. In the example illustrated in FIG. 4 the soundwave barriers 42 lie in front of the odd antinode zones B1, B3, B5 and prevent the passage of the soundwaves originating from said antinode zones. In contrast, in front of the even antinode zones B0, B2, B4, B6 soundwavepermeable regions 43 are disposed which in the simplest case, as illustrated in FIG. 4, can be formed by free openings (intermediate spaces, holes). The soundwaves generated by the antinode zones B0, B2, B4, B6 can pass without restriction through the regions 43. Therefore, on the other side of the sonic beam shaper only equiphase soundwaves are propagated. These equiphase soundwaves produce, as is known, a radiation pattern having a pronounced lobe in the direction of the radiation axis lying perpendicularly to the plane of the flexural oscillating plate whilst interfering side lobes are largely suppressed. The aperture angle of the lobe is the smaller the greater the diameter of the flexural oscillator plate 30 with respect to the wavelength of the soundwave in the transmission medium.

The soundwave barriers 42 of the sonic beam shaper 40 can prevent the passage of the soundwaves either by reflection or absorption or by both effects simultaneously. On reflection the blocked soundwaves can travel several times to and fro between the flexural oscillator plate and the soundwave barriers 42 until they finally die out. It is important for the soundwave barriers 42 to be decoupled well acoustically from the flexural oscillator plate 30 to prevent them from oscillating themselves and radiating soundwaves. This acoustic decoupling can be achieved in that the soundwave barriers are disposed at an adequate distance from the flexural oscillator plate 30.

In the example of embodiment illustrated in FIG. 2 the sound beam shaper 40 is made from a thin circular metal plate which has arcuate cutouts 44 which together with a circular hole 45 in the centre form the soundwave-permeable regions 43. The annular portions 46 of the metal plate remaining between the cutouts form the soundwave barriers 42. They are held together by radial webs 47 which remain along two diameters lying at right-angles to each other between the cutouts 44.

At three points of the periphery of the sonic beam shaper 40 lugs 48 are integrally formed and serve for securing to the end face of the edge 15 of the housing 11 by means of the screws 41.

The material of which the sonic beam shaper 40 consists can be selected in accordance with the ambient conditions under which the acoustic transducer system operates. In particular in the field of filling level measurement the sonic beam shaper may be subjected to high mechanical stresses or chemically aggressive media. When high mechanical stresses are encountered the sonic beam shaper may consist of steel whereas when subjected to the action of chemically aggressive media it will consist preferably of corrosion-resistant materials, such as coated metal or special steels. Of course, the sonic beam shaper may also be made from plastic.

In the example of embodiment illustrated the width of the soundwave barriers 42 and consequently also the width of the soundwave-permeable regions 43 disposed therebetween is equal to the width of the corresponding antinode zones between two node lines of the flexural oscillator plate 30. This condition is in no way absolutely essential. The soundwave barriers may also be wider or narrower than the antinode zones and the overlapping regions may be variable over the diameter of the flexural oscillator plate. The sound radiation is not appreciably impaired thereby because due to their small deflection the regions of the flexural oscillator plate lying in the vicinity of the node lines contribute only slightly to the sound intensity. For the same reason the acoustic transducer system equipped with the sonic beam shaper also has a good band width. A change in the operating frequency results in a displacement of the node lines on the flexural oscillator plate so that the antinode zones shift with respect to the soundwave barriers of the sonic beam shaper. Up to a certain extent of this shift the sound radiation is not appreciably impaired.

On the other hand, the acoustic transducer system can be very easily and rapidly adapted to a different operating frequency by exchanging the sleeve 32. It is then only necessary to replace the sonic beam shaper by another sonic beam shaper in which the form and position of the soundwave barriers are adapted to the course of the node lines which arise at the different operating frequency.

When the acoustic transducer system is used for filling level measurement it has the additional advantage of being very indifferent to encrustation. In particular when measuring the level of dusty, pulverulent or tacky filling materials the problem is encountered of material encrustations on the acoustic radiator and such encrustation can lead to a damping and/or frequency shift which interferes with the function of the system. In the acoustic transducer system the tendency to form deposits or encrustation can be reduced by suitable choice of the material for the sonic beam shaper. Furthermore, a self-cleaning effect arises by the flexural oscillator plate oscillating with relatively large amplitude. If nevertheless a material deposit forms the sonic beam shaper can easily be removed for cleaning. Finally, it is also possible to cover the entire sonic beam shaper or at least the intermediate spaces between the soundwave barriers with a material permeable for soundwaves.

The effect achieved with the sonic beam shaper is completely independent of the form of the remaining parts of the acoustic transducer system, which has been illustrated only by way of example Thus, instead of the piezoelectric transducer any desired other electroacoustic transducer may be connected to the flexural oscillator plate 30, for example a magnetostrictive, electromagnetic or electrodynamic transducer. The form of the flexural oscillator plate may also be varied as desired; it may be example have different longitudinal and transverse dimensions in order to obtain different directional patterns in different directions of space. It is each case necessary only to determine the course of the node lines at the operating frequency and to shape the soundwave barriers of the sonic beam shaper in accordance with said node line paths.

The sonic beam shaper may also be modified in many respects. Instead of making it from one piece, as in the example of embodiment of FIG. 2, the soundwave barriers may also be separate parts which are held in the correct position by suitable supports. The position of the soundwave barriers and of the soundwave-permeable regions can be interchanged so that in the centre instead of the central opening 45 a soundwave barrier is located. However, generally it is advantageous to provide in the middle a central opening because the largest deflection is present there and this region therefore makes a particularly high contribution to the radiated sound intensity. Furthermore, the central opening leaves free the screw 33 and the sleeve 32.

FIG. 5 shows schematically a modified example of embodiment of the soundwave barriers 42 of the example of embodiment of FIG. 2. The modification consists in that a sound-absorbing material 51 is applied to the faces of the metal rings 46 facing the flexural oscillator plate 30. Another modification illustrated in FIG. 6 consists in that the entire sonic beam shaper for protection against corrosion is coated with a corrosion-resistant material 52, such as polytetrafluoroethylene which can additionally have the property of absorbing soundwaves.

Figure 7:
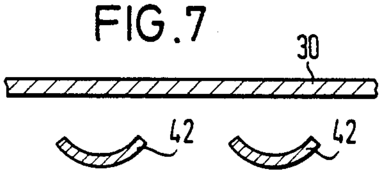
Figure 8:
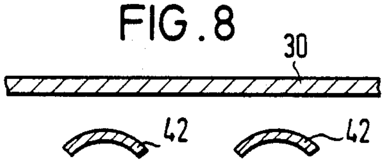
Figure 9:
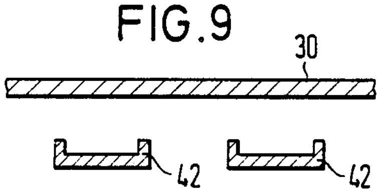
Figure 10:
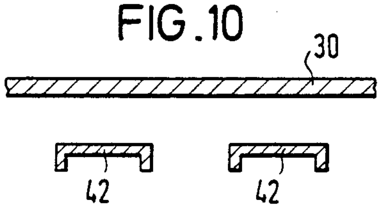

Furthermore, it is not necessary for the soundwave barriers to be planar. In FIGS. 7 to 12 various possible cross-sectional forms of soundwave barriers 42 are illustrated as regards their position with respect to a portion of the flexural oscillator plate 30. In FIG. 7 the cross-sectional form is concave, in FIG. 8 convex. In FIGS. 9 and 10 the soundwave barriers have a rectangular U profile which in FIG. 9 is open towards the flexural oscillator plate 30 and in FIG. 10 towards the radiation direction. In FIGS. 11 and 12 the profile of the soundwave barriers 32 is roof-shaped, being open towards the flexural oscillator plate 30 in FIG. 11 and open towards the radiation direction in FIG. 12.

FIG. 13 shows an additional feature for preventing deposits or encrustation between the soundwave barriers 42 and the flexural oscillator plate 30. For this purpose along the edges of each soundwave barrier 42 sealing lips 53 are disposed which bear on the flexural oscillator plate 30 and thus seal from the outside the entire intermediate space between the flexural oscillator plate 30 and each soundwave barrier 42. The sealing lips consist of a very yieldable elastic material so that any mechanical coupling between the flexural oscillator plate 30 and the soundwave barriers 42 is avoided. Since the yieldable sealing lips 53 bear on the flexural oscillator plate 30 along the node lines they do not impair at all the oscillations thereof.

We claim:

1. An acoustic transducer system having a predetermined operating frequency, the system comprising a flexural vibrating plate having a radiating surface and a higher flexural mode of resonance at substantially the operating frequency of the system, the radiating surface having a plurality of antinodal zones including a first set of antinodal zones and a second set of antinodal zones separated from the first set of antinodal zones by a plurality of nodal lines, the first and second sets of antinodal zones having an equal vibrating frequency, the antinodal zones in the first set vibrating in equiphase with each other and in counterphase with the antinodal zones in the second set, an electroacoustic transducer connected to the flexural vibrating plate to transmit or receive sound waves from the radiating surface, and a sonic beam shaper having a plurality of sound wave barriers substantially impermeable to sound waves disposed in front of the first set of antinodal zones and situated in a spaced apart relation from the flexural vibrating plate, the sonic beam shaper further including a plurality of sound wave permeable regions disposed in front of the second set of antinodal zones.

2. The system of claim 1, wherein each of the first set of antinodal zones has a predetermined width, and the sound wave barrier associated with each of the first set of antinodal zones has a predetermined width different from the predetermined width of the associated antinodal zone.

3. The system of claim 2, wherein the flexural vibrating plate has a predetermined diameter, and the difference between the widths of the sound wave barriers and the widths of the associated antinodal zones vary over the diameter of the flexural vibrating plate.

4. The system of claim 1, wherein the plurality of sound wave barriers include a bottom portion facing the flexural vibrating plate, the bottom portion being covered with a sound wave absorbing material.

5. The system of claim 1, wherein the plurality of sound wave barriers are formed from a sound wave absorbing material.

6. The system of claim 1, wherein the sound wave barriers are formed to include a first edge, a second edge, and sealing lips extending away from the first and second edges to abut the surface of the flexural vibrating plate, thereby forming a sealed region between the plurality of sound wave barriers and the flexural vibrating plate to prevent deposits or encrustations of a foreign material from collecting between the sound wave barriers and the plate when the system is used to measure a filling level of the material.

* * * * *